(12) United States Patent
Lee

(10) Patent No.: US 7,675,112 B2
(45) Date of Patent: Mar. 9, 2010

(54) SEMICONDUCTOR DEVICE WITH A SURROUNDED CHANNEL TRANSISTOR

(75) Inventor: Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/585,106

(22) Filed: Oct. 24, 2006

(65) Prior Publication Data

US 2008/0023742 A1    Jan. 31, 2008

(30) Foreign Application Priority Data

Jul. 28, 2006    (KR) .................... 10-2006-0071539

(51) Int. Cl.
*H01L 29/94* (2006.01)
(52) U.S. Cl. .................. 257/330; 257/296; 257/192; 257/499; 257/E29.321
(58) Field of Classification Search .............. 257/296, 257/192, 330, 499, E29.321
See application file for complete search history.

(56) References Cited

U.S. PATENT DOCUMENTS 5,578,513 A * 11/1996 Maegawa .................... 438/151
6,476,444 B1 * 11/2002 Min ............................. 257/330
2005/0176186 A1   8/2005 Lee ............................. 438/157
2005/0218427 A1 * 10/2005 Joshi et al. .................. 257/192
2006/0049455 A1 *  3/2006 Jang et al. ................... 257/330

FOREIGN PATENT DOCUMENTS

JP    200306009     11/2003
JP    2004006736 A   1/2004

* cited by examiner

*Primary Examiner*—Cuong Q Nguyen
*Assistant Examiner*—Trang Q Tran
(74) *Attorney, Agent, or Firm*—Townsend and Townsend and Crew LLP

(57) ABSTRACT

The semiconductor device includes a device isolation structure, a surrounded channel structure, and a gate electrode. The device isolation structure is formed in a semiconductor substrate to define an active region. The surrounded channel structure connecting source/drain regions is separated from the semiconductor substrate under the active region by a given distance. The gate electrode surrounds the surrounded channel structure.

6 Claims, 7 Drawing Sheets

SEMICONDUCTOR DEVICE WITH A SURROUNDED CHANNEL TRANSISTOR

CROSS-REFERENCES TO RELATED APPLICATIONS

The present application claims priority to Korean patent application number 10-2006-0071539, filed on Jul. 28, 2006, which is incorporated by reference in its entirety.

BACKGROUND OF THE INVENTION

The present invention relates to a memory device. More particularly, the present invention relates to a semiconductor device having a surrounded channel transistor and a method for fabricating the same.

When the channel length of a cell transistor is decreased, the ion concentration of the cell channel structure is generally increased in order to maintain threshold voltage of the cell transistor. Due to the increase in the ion concentration of the cell channel structure, an electric field in the source/drain regions of the cell transistor is enhanced to increase leakage current. This results in the degradation of the refresh characteristics of a DRAM structure. In addition, as the semiconductor device shrinks to smaller sizes, it is difficult to effectively control the short channel effect ("SCE"). Therefore, Multi-channel Field Effect Transistors ("McFET") such as a recessed channel transistor and a fin channel transistor have been proposed to increase the channel length of the cell transistor.

However, the degree of process complexity is increased due to the additional deposition process and planarization process in the McFET technology. As the design rules of the device become smaller, it is difficult to control the height and width of the fin channel transistor. Because the bottom of the fin channel transistor is connected to the semiconductor substrate, punch-through between source/drain regions easily occurs when the height of the fin channel transistor is less than the depth of the source/drain regions according to shrinkage of the design rules. Accordingly, there is a need for a new structure of the transistor in order to improve the performance of the device.

BRIEF SUMMARY OF THE INVENTION

Embodiments of the present invention are directed to semiconductor devices having a surrounded channel transistor. According to one embodiment, the surrounded channel transistor has a surrounded channel structure separated from a semiconductor substrate thereunder and a gate structure that surrounds the surrounded channel structure.

In one embodiment of the present invention, a semiconductor device comprises a device isolation structure, a surrounded channel structure, and a gate electrode. The device isolation structure is formed in a semiconductor substrate to define an active region. The surrounded channel structure connecting source/drain regions is separated from the semiconductor substrate under the active region by a given distance. The gate electrode surrounds the surrounded channel structure.

According to another embodiment of the present invention, a method for fabricating a semiconductor device includes forming a device isolation structure in a semiconductor substrate to form an active region; etching the active region by a recess mask to form a recess channel structure, wherein a surrounded channel structure separated from the semiconductor substrate under the active region by a given distance is formed in the recess channel structure; and forming a gate structure including a gate hard mask layer pattern and a gate electrode, wherein the gate electrode fills up the recess channel structure to surround the surrounded channel structure.

DESCRIPTION OF SPECIFIC EMBODIMENTS

The present invention relates to semiconductor devices having a surrounded channel transistor and a method for fabricating the same. The surrounded channel transistor has a surrounded channel structure separated from a semiconductor substrate under the surrounded channel structure by a given distance and a gate structure that surrounds the surrounded channel structure. Accordingly, the surrounded channel transistor provides a gate controllability that is significantly improved due to increase in the current driving force and improvement of short channel effect ("SCE") of the device.

Figure 1:
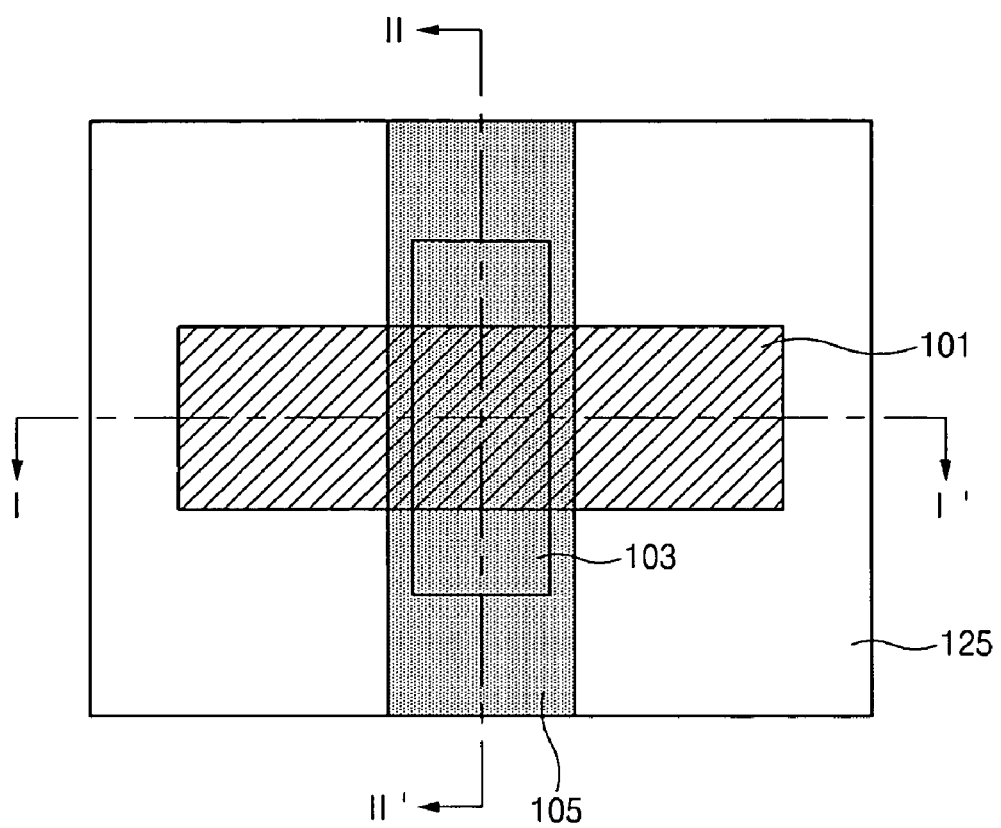
FIG. 1 is a simplified layout of a semiconductor device according to one embodiment of the present invention.

FIG. 1 illustrates a simplified layout of a semiconductor device according to one embodiment of the present invention. The semiconductor device includes an active region 101 and a recess gate region 103, and a gate region 105. A device isolation structure 125 defines the active region 101. In one embodiment of the present invention, the recess gate region 103 is islanded. A width of the recess gate region 103 in a longitudinal direction of the gate region 105 is greater than that of the active region 101.

Figure 2:
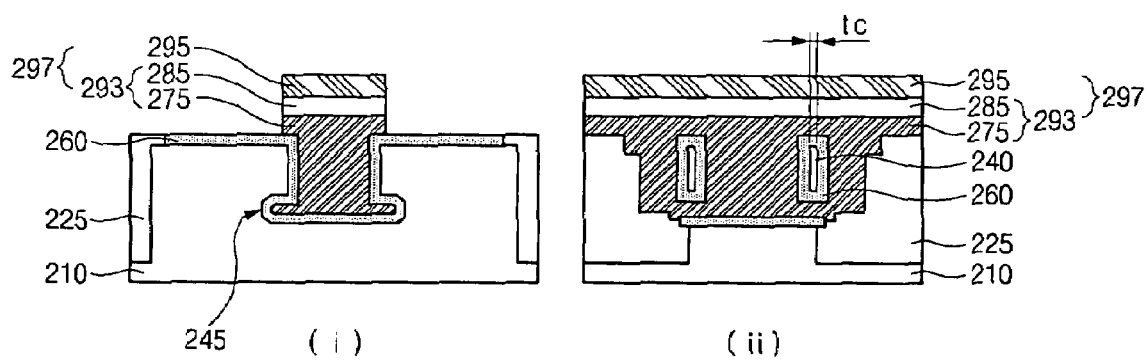
FIG. 2 is a simplified cross-sectional view of a semiconductor device according to one embodiment of the present invention.

FIG. 2 illustrate a simplified cross-sectional view of a semiconductor device according to one embodiment of the present invention, wherein FIG. 2(i) is a cross-sectional view taken along a latitudinal direction in accordance with the line I-I' of FIG. 1 and FIG. 2(ii) is a cross-sectional view taken along a longitudinal direction in accordance with the line II-II' of FIG. 1. A semiconductor device includes a device isolation structure 225, a surrounded channel structure 240, and a gate electrode 293. The device isolation structure 225 defines an active region 101 shown in FIG. 1. The surrounded channel structure 240 connects source/drain regions (not shown), and is separated from a semiconductor substrate 210 under the surrounded channel structure 240 by a given distance. The gate electrode 293 surrounds the surrounded channel structure 240. In one embodiment of the present invention, at least one of the surrounded channel structure 240 is formed in the semiconductor substrate 210 under the active region 101 shown in FIG. 1 in a longitudinal direction of the gate region 105. In particular, dual surrounded channel structures 240 are preferably formed as shown in FIG. 2(ii). In addition, the semiconductor device further includes a recess channel structure 245 in a longitudinal direction of the active region 101 shown in FIG. 1. A width of the lower part of the recess channel structure 245 is at least equal to that of the upper part of the recess channel structure 245. In another embodiment, the given distance separated between the surrounded channel structure 240 and the semiconductor substrate 210 under the surrounded channel structure 240 ranges from about 100 Å to about 2,000 Å. A width of the surrounded channel structure 240 in a longitudinal direction of the gate region 105 shown in FIG. 1 ranges from about 50 Å to about 1,000 Å. In a third embodiment, the gate electrode 293 comprises a lower gate electrode 275 and an upper gate electrode 285.

Figure 3A:
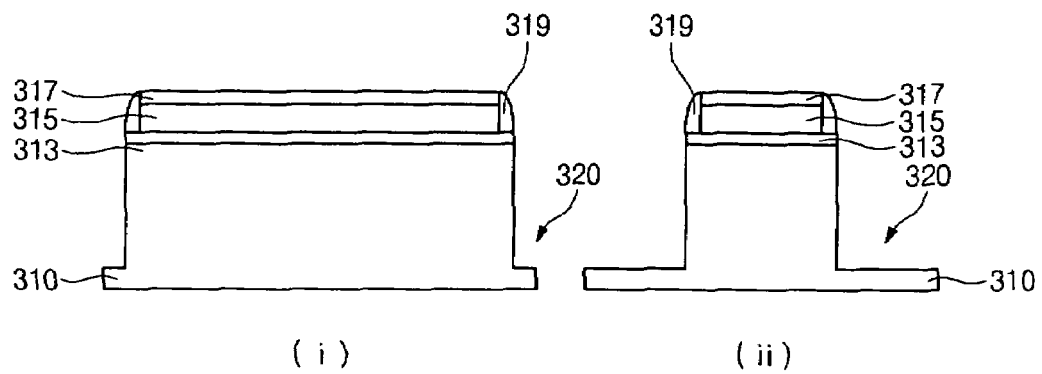
FIGS. 3a to 3h are simplified cross-sectional views illustrating a method for fabricating a semiconductor device according to one embodiment of the present invention.

FIGS. 3a to 3h illustrate a method for fabricating a semiconductor device according to one embodiment of the present invention, wherein FIGS. 3a(i) through 3h(i) are cross-sectional views taken along a latitudinal direction in accordance with the line I-I' of FIG. 1 and FIGS. 3a(ii) through 3h(ii) are cross-sectional views taken along a longitudinal direction in accordance with the line II-II' of FIG. 1. A first pad insulating film 313, a second pad insulating film (not shown), and a first hard mask layer (not shown) are formed over a semiconductor substrate 310. A photoresist film (not shown) is formed over the first hard mask layer, and then exposed and developed using a device isolation mask (not shown) to form a photoresist film pattern (not shown). The first hard mask layer and the second pad insulating film are etched using the photoresist film pattern as an etching mask to form a first hard mask layer pattern 317 and the second pad insulating film pattern 315. The photoresist film pattern is removed. A first insulating spacer 319 is formed at a sidewall of the first hard mask layer pattern 317 and the second pad insulating film pattern 315. The first pad insulating film 313 and the semiconductor substrate 310 are etched using the first insulating spacer 319 and the first hard mask layer pattern 317 as an etching mask to form a trench for device isolation 320. In one embodiment of the present invention, the first pad insulating film 313 includes an oxide film. The second pad insulating film includes a nitride film. The first hard mask layer is selected from the group consisting of an oxide film, a polysilicon layer, and combination thereof. In addition, the first insulating spacer 319 is selected from the group consisting of an oxide film, a nitride film, and combination thereof. On the other hand, a width of the first insulating spacer 319 can be determined according to a horizontal thickness of a surrounded channel structure to be formed in a subsequent process. The width of the first insulating spacer 319 is greater than the horizontal thickness of the surrounded channel structure considering a thickness of the semiconductor substrate 310 to be lost in subsequent etching and thermal oxidizing processes. In particular, the width of the first insulating spacer 319 ranges from about 100 Å to about 1,200 Å.

According to another embodiment of the present, a photoresist film pattern (not shown) defining a device isolation region is formed over the semiconductor substrate 310 having the first pad insulating film 313, a second pad insulating film, and the first hard mask layer. The first hard mask layer, the second pad insulating film, and the first pad insulating film 313 are etching using the photoresist film pattern as an etching mask to form a first hard mask layer pattern, a second pad insulating film pattern, and a first pad insulating film pattern. The photoresist film pattern is removed. A first insulating spacer is formed at a sidewall of the first hard mask layer pattern, the second pad insulating film pattern, and the first pad insulating film pattern. The semiconductor substrate 310 is etched using the first insulating spacer and the first hard mask layer pattern as an etching mask to form a trench for device isolation 320.

Figure 3B:
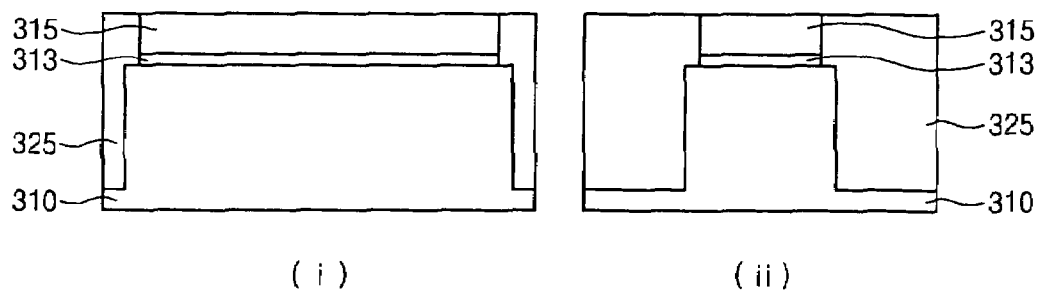

Referring to FIG. 3b, the first insulating spacer 319 and the first pad insulating film 313 under the first insulating spacer 319 are removed to expose the semiconductor substrate 310 under the first insulating spacer 319. An insulating film for device isolation (not shown) is formed over an entire surface of the resultant (i.e. over the trench 320 and the first hard mask layer 317 including the exposed semiconductor substrate 310). The insulating film for device isolation is polished until the second pad insulating film pattern 315 is exposed to form a device isolation structure 325 defining the active region 101 shown in FIG. 1. In one embodiment of the present invention, a film selected from the group consisting of a thermal oxide film, a nitride film, an oxide film, and combinations thereof may be formed at the interface between the insulating film for device isolation and the trench 320. the insulating film for device isolation includes an oxide film. In addition, the removing process for the first insulating spacer 319 and the underlying first pad insulating film 313 is performed by a wet etching method. In another embodiment, the polishing process for forming the device isolation structure 325 is performed by a chemical mechanical planarization ("CMP") method or an etch-back method.

Figure 3C:
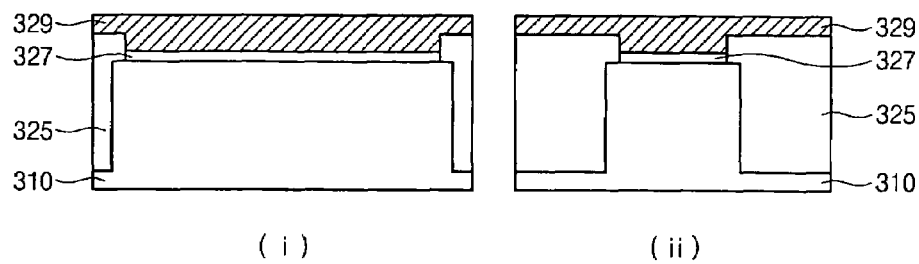

Referring to FIG. 3c, a given thickness of the device isolation structure 325 is etched to lower the height of the device isolation structure 325. The second pad insulating film pattern 315 and the first pad insulating film 313 are removed to expose the semiconductor substrate 310. A buffer layer 327 is formed over the exposed semiconductor substrate 310. A well and channel ion implanting process is performed to inject impurities into the semiconductor substrate 310. A second hard mask layer 329 is formed over an entire surface of the resultant (i.e. over the semiconductor substrate 310 and the device isolation structure 325). In one embodiment, the removing process for the second pad insulating film pattern 315 and the first pad insulating film 313 is performed by a wet etching method. In addition, the buffer layer 327 includes an oxide film. The second hard mask layer 329 is selected from the group consisting of a polysilicon layer, an amorphous carbon film, a nitride film, a SiON film, and combinations thereof.

Figure 3D:
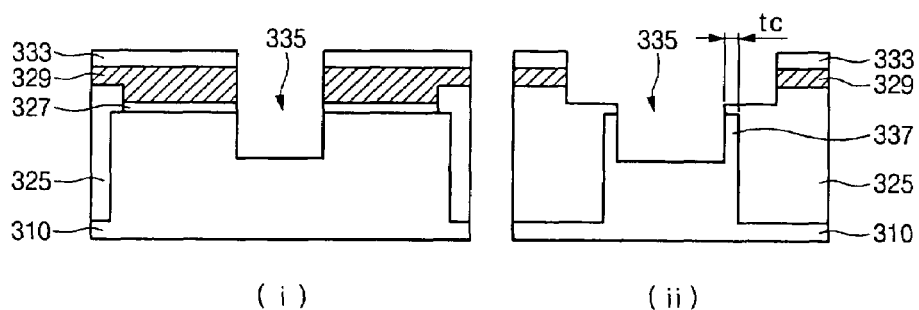

Referring to FIG. 3d, a photoresist film is formed over the second hard mask layer 329, and then exposed and developed using a recess gate mask (not shown) to form a photoresist film pattern 333 defining the recess gate region 103 shown in FIG. 1. The second hard mask layer 329 is etched using the photoresist film pattern 333 as an etching mask to form a recess region (not shown) exposing a portion of the buffer layer 327 and the device isolation structure 325. The buffer layer 327 and the semiconductor substrate 310 exposed in the recess region are etched to form a first recess 335. The photoresist film pattern 333 is removed. In one embodiment of the present invention, the recess region is islanded. A width of the islanded recess region in a longitudinal direction of the gate region 105 shown in FIG. 1 is greater than that of the active region 101. In addition, a fin-type semiconductor substrate 337 is formed at a sidewall of the device isolation structure 325 next to the first recess 335 in a longitudinal direction of the gate region 105 shown in FIG. 1. A thickness tc of the fin-type semiconductor substrate 337 is greater than the horizontal thickness of the surrounded channel structure to be formed in a subsequent process considering the lost thickness of the semiconductor substrate in a subsequent thermal oxidizing process. In particular, the thickness tc of the fin-type semiconductor substrate 337 ranges from about 70 Å to about 1,150 Å.

Figure 3E:
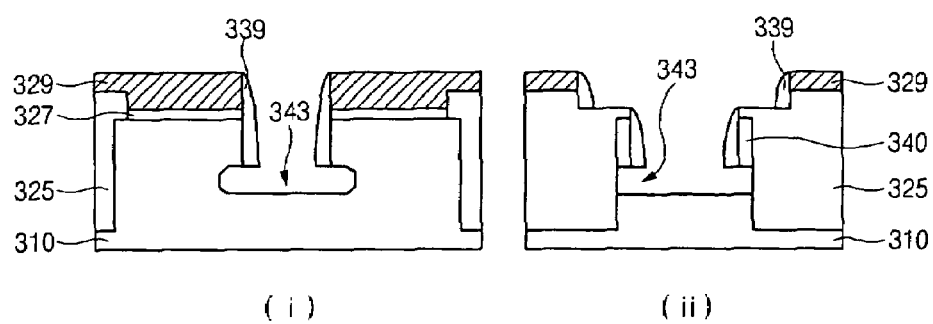

Referring to FIG. 3e, a second insulating film (not shown) is formed over an entire surface of the resultant (i.e. over the second hard mask layer 329 and the first recess 335). The second insulating film is etched to form a second insulating spacer 339 at a sidewall of the first recess 335. The semiconductor substrate 310 exposed at the bottom of the first recess 335 is etched to form a second recess 343. In one embodiment, the etching process for forming the second recess 343 is performed by an isotropic etching method. At this time, a width of the second recess 343 in a longitudinal direction of the active region 101 shown in FIG. 1 is at least equal to that of the first recess 335 shown in FIG. 3d. In addition, the fin-type semiconductor substrate 337 shown in FIG. 3d is now separated from the underlying semiconductor substrate 310 by a given distance to form a surrounded channel structure 340 between the device isolation structure 325 and the second insulating spacer 339. In another embodiment, at least one of the surrounded channel structure 340 is formed. In particular, dual surrounded channel structures 340 are preferably formed. On the other hand, the surrounded channel structure 340 in a longitudinal direction of the active region 101 shown in FIG. 1 connects the semiconductor substrates 310 where source/drain regions are to be formed in a subsequent process. In other embodiment, the given distance between the surrounded channel structure 340 and the underlying semiconductor substrate 310 ranges from about 200 Å to about 2,000 Å.

Figure 3F:
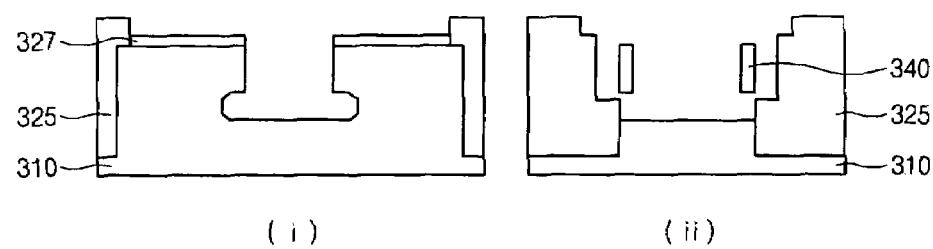

Referring to FIG. 3f, the device isolation structure 325 exposed in the first recess 335 shown in FIG. 3d and the second recess 343 shown in FIG. 3e is etched to expose the upper part of the surrounded channel structure 340 and its portion next to the device isolation structure 325. The second insulating spacer 339 and the second hard mask layer 329 are removed to completely expose the surrounded channel structure 340. In one embodiment of the present invention, the removing process for the second hard mask layer 329 and the second insulating spacer 339 is performed by a wet etching method.

Figure 3G:
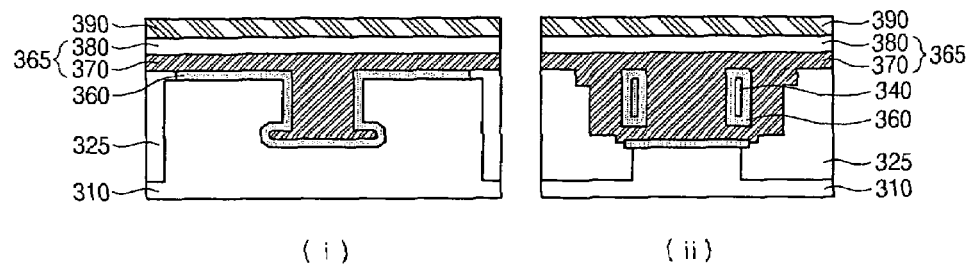

Referring to FIG. 3g, the buffer layer 327 is removed to expose the semiconductor substrate 310 including the surrounded channel structure 340. A gate insulating film 360 is formed over the exposed semiconductor substrate 310 to surround the surrounded channel structure 340. A gate conductive layer 365 is formed over an entire surface of the resultant (i.e. over the gate insulating film 360 and the device isolation structure 325) to surround the surrounded channel structure 340 having the gate insulating film 360 and fill the first recess 335 shown in FIG. 3d and the second recess 343 shown in FIG. 3e. A gate hard mask layer 390 is formed over the gate conductive layer 365. In one embodiment, a removing process for the buffer layer 327 is performed by a wet etching method. In another embodiment, the gate conductive layer 365 comprises a stacked structure of a lower gate conductive layer 370 and an upper gate conductive layer 380. In addition, the lower gate conductive layer 370 includes a polysilicon layer. The upper gate conductive layer 380 is selected from the group consisting of a cobalt (Co) layer, a nickel (Ni) layer, a titanium (Ti) layer, a titanium nitride (TiN) film, a tungsten (W) layer, a tungsten nitride (WN) film, an aluminum (Al) layer, a copper (Cu) layer, a tungsten silicide ($WSi_x$) layer, a cobalt silicide ($Cosi_x$) layer, a titanium silicide ($TiSi_x$) layer, a nickel silicide ($NiSi_x$) layer, and combinations thereof.

Figure 3H:
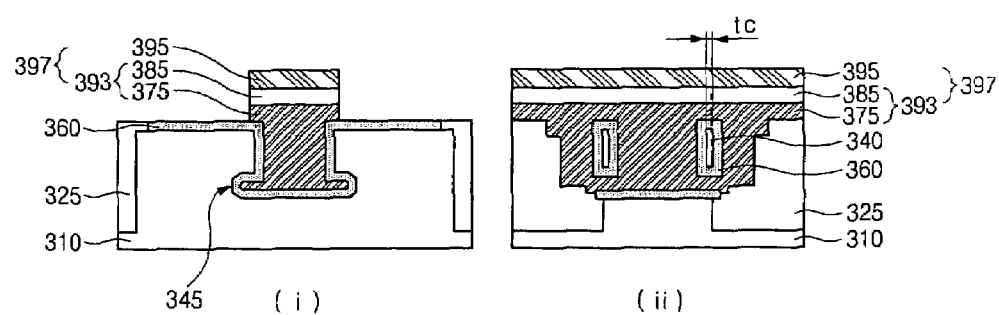

Referring to FIG. 3h, the gate hard mask layer 390 and the gate conductive layer 365 are etching using a gate mask (not shown) as an etching mask to form a gate structure 397 comprising a gate hard mask layer pattern 395 and a gate electrode 393. Here, the gate structure 397 includes a recess channel structure 345 in a longitudinal direction of the active region 101 shown in FIG. 1 and the surrounded channel structure 340 in a longitudinal direction of the gate region 105 shown in FIG. 1 that is surrounded with the gate electrode 393. In another embodiment, the gate electrode 393 comprises a stacked structure of a lower gate electrode 375 and an upper gate electrode 385.

In addition, subsequent processes such as a process for forming a landing plug, a process for forming a bit line contact and a bit line, a process for forming a capacitor, and a process for forming an interconnect may be performed.

Figure 4A:
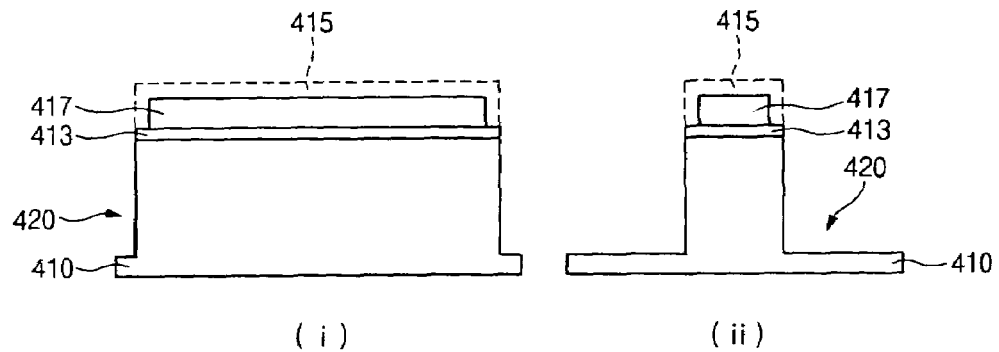
FIGS. 4a and 4b are simplified cross-sectional views illustrating a method for fabricating a semiconductor device according to another embodiment of the present invention.
Figure 4B:
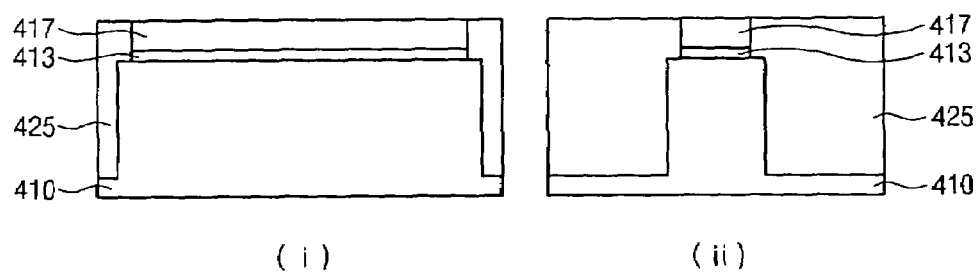

FIGS. 4a and 4b illustrate a method for fabricating a semiconductor device according to another embodiment of the present invention. Here, FIG. 4a(i) and 4b(i) are cross-sectional views taken along a latitudinal direction in accordance with the line I-I' of FIG. 1, and FIGS. 4a(ii) and 4b(ii) are cross-sectional views taken along a longitudinal direction in accordance with the lines II-II' of FIG. 1.

Referring to FIG. 4a, a first pad insulating film 413 and a second pad insulating film 415 are formed over a semiconductor substrate 410. A photoresist film (not shown) is formed over the second pad insulating film 415, and then exposed and developed using a device isolation mask (not shown) to form a photoresist film pattern (not shown). The second pad insulating film 415, the first pad insulating film 413, and the semiconductor substrate 410 are etched using the photoresist film pattern as an etching mask to form a trench 420 for device isolation. The photoresist film pattern is removed. A given thickness of the second pad insulating film 415 is etched to form a second pad insulating film pattern 417, which the second pad insulating film 415 is reduced over the first pad insulating film 413. In one embodiment of the present invention, the first pad insulating film 413 includes an oxide film. The second pad insulating film 415 includes a nitride film. In addition, a reduced thickness of one side of the second pad insulating film 415 during the etching process for the second pad insulating film 415 can be determined according to a horizontal thickness of a surrounded channel structure to be formed in a subsequent process. The reduced thickness of one side of the second pad insulating film 415 is greater than the horizontal thickness of the surrounded channel structure considering a thickness of the semiconductor substrate 410 to be lost in subsequent etching and thermal oxidizing processes. In particular, the reduced thickness of one side of the second pad insulating film 415 ranges from about 100 Å to about 1,200 Å.

Referring to FIG. 4b, the first pad insulating film 413 exposed under the second pad insulating film pattern 417 is etched to expose the semiconductor substrate 410. An insulating film for device isolation (not shown) is formed over an entire surface of the resultant (i.e. over the second pad insulating film pattern 417 and the trench 420 including the exposed semiconductor substrate 410). The insulating film for device isolation is polished until the second pad insulating film pattern 417 is exposed to form a device isolation structure 425. In one embodiment, the polishing process for forming the device isolation structure 425 is performed by a CMP method or an etch-back method. In addition, subsequent processes may be performed by the method for fabricating a semiconductor device shown in FIGS. 3c to 3h.

As described above, the surrounded channel structure according to one embodiment of the present invention can be formed using the etching process for the device isolation structure and the recess channel structure, thereby simplifying the process for fabricating the semiconductor device. In addition, the horizontal thickness of the surrounded channel structure can be determined using the sidewall spacer formed during the process for forming the device isolation structure. As a result, the process margin of the present invention can be improved. Since the surrounded channel structure is separated from the semiconductor substrate under the surrounded channel structure, the punch-through between source/drain regions can be prevented. As a result, the current driving force of the device can be increased, and the SCE of the device can be improved. Accordingly, a semiconductor device with a low voltage and high speed operation can be realized.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a device isolation structure formed in a semiconductor substrate to define an active region;
   a surrounded channel structure separated from the semiconductor substrate under the active region by a given distance, wherein the surrounded channel structure is formed in a recess of the active region, the surrounded channel structure including a plurality of lateral structures formed in the semiconductor substrate under the active region and extending in a longitudinal direction of a gate region; and
   a gate electrode completely surrounding the surrounded channel structure.

2. The semiconductor device according to claim 1, further comprising a recess channel structure in a longitudinal direction of the active region, wherein a width of the lower part of the recess channel structure is greater than that of the upper part of the recess channel structure.

3. The semiconductor device according to claim 1, wherein the given distance ranges from about 100 Å to about 2,000 Å.

4. The semiconductor device according to claim 1 wherein a horizontal width of the surrounded channel structure in a longitudinal direction of the gate region ranges from about 50 Å to about 1,000 Å.

5. The semiconductor device according to claim 1, wherein the surrounded channel structure is a dual structure.

6. The semiconductor device according to claim 2, further comprising a gate insulating film placed both between the surrounded channel structure and the gate electrode and between the recess channel structure and the gate electrode.

* * * * *